(12) United States Patent
Mada (10) Patent No.: US 10,236,312 B2
(45) Date of Patent: Mar. 19, 2019

(54) CAMERA MODULE AND ELECTRONIC APPARATUS TO LOWER RISK OF BREAKAGE OF CAMERA MODULE

(71) Applicant: SONY CORPORATION, Tokyo (JP)

(72) Inventor: Yusuke Mada, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/547,254

(22) PCT Filed: Feb. 2, 2016

(86) PCT No.: PCT/JP2016/053009
§ 371 (c)(1),
(2) Date: Jul. 28, 2017

(87) PCT Pub. No.: WO2016/132883
PCT Pub. Date: Aug. 25, 2016

(65) Prior Publication Data
US 2018/0175089 A1    Jun. 21, 2018

(30) Foreign Application Priority Data

Feb. 16, 2015  (JP) .................................. 2015-027459

(51) Int. Cl.
*H01L 27/146* (2006.01)
*H01L 23/00* (2006.01)
(Continued)

(52) U.S. Cl.
CPC .......... *H01L 27/14618* (2013.01); *G02B 7/02* (2013.01); *H01L 24/73* (2013.01);
(Continued)

(58) Field of Classification Search
CPC .. H01L 27/24618; G02B 7/02; H04N 5/2251; H04N 5/369
See application file for complete search history.

(56) References Cited

U.S. PATENT DOCUMENTS 7,294,827 B2 * 11/2007 Tan ................... H01L 27/14618
250/239
2004/0223072 A1 * 11/2004 Maeda .............. H01L 27/14618
348/340
(Continued)

FOREIGN PATENT DOCUMENTS

| CN | 1599428 A | 3/2005 |
|---|---|---|
| CN | 1691344 A | 11/2005 |

(Continued)

OTHER PUBLICATIONS

International Search Report and Written Opinion of PCT Application No. PCT/JP2016/053009, dated Apr. 26, 2016, 02 pages of English Translation and 06 pages of ISRWO.

*Primary Examiner* — Nelson D. Hernández Hernández
(74) *Attorney, Agent, or Firm* — Chip Law Group (57) ABSTRACT

The present technology relates to a camera module and an electronic apparatus that can lower the risk of breakage. An imaging element has a light receiving surface to receive light, and is flip-chip mounted on a base. A joining material is joined to the optical back surface of the imaging element so that a space is formed between the joining material and a back-surface-side member provided on the side of the optical back surface on the opposite side of the imaging element from the light receiving surface. The present technology can be applied to camera modules and the like that capture images, for example.

5 Claims, 9 Drawing Sheets

(51) Int. Cl.
*H01L 27/14* (2006.01)
*H04N 5/225* (2006.01)
*G02B 7/02* (2006.01)
*H04N 5/369* (2011.01)

(52) U.S. Cl.
CPC .............. *H01L 24/83* (2013.01); *H01L 24/92* (2013.01); *H01L 27/14* (2013.01); *H04N 5/2251* (2013.01); *H04N 5/2253* (2013.01); *H04N 5/2257* (2013.01); *H04N 5/369* (2013.01); *H01L 24/16* (2013.01); *H01L 24/48* (2013.01); *H01L 24/81* (2013.01); *H01L 2224/48091* (2013.01); *H01L 2224/48227* (2013.01); *H01L 2224/73253* (2013.01); *H01L 2224/83139* (2013.01); *H01L 2224/83194* (2013.01); *H01L 2224/83203* (2013.01); *H01L 2224/83851* (2013.01); *H01L 2224/92225* (2013.01); *H01L 2924/00014* (2013.01); *H01L 2924/15151* (2013.01); *H01L 2924/16151* (2013.01); *H01L 2924/16152* (2013.01)

(56) References Cited

U.S. PATENT DOCUMENTS

2005/0035421 A1    2/2005    Kayanuma et al.
2005/0236685 A1    10/2005   Minamio

FOREIGN PATENT DOCUMENTS

| | | |
|---|---|---|
| DE | 102004039018 A1 | 4/2005 |
| JP | 01-087562 U | 6/1989 |
| JP | 01-087562 U | 4/1998 |
| JP | 2002-299592 A | 10/2002 |
| JP | 2005-64591 A | 3/2005 |
| JP | 2005-064591 A | 3/2005 |
| JP | 2005-278092 A | 10/2005 |
| JP | 2005-317564 A | 11/2005 |
| JP | 2006-270939 A | 10/2006 |
| KR | 10-2005-0016220 A | 2/2005 |
| KR | 10-2006-0047342 A | 5/2006 |
| TW | 200536113 A | 11/2005 |

* cited by examiner

CAMERA MODULE AND ELECTRONIC APPARATUS TO LOWER RISK OF BREAKAGE OF CAMERA MODULE

CROSS REFERENCE TO RELATED APPLICATIONS

This application is a U.S. National Phase of International Patent Application No. PCT/JP2016/053009 filed on Feb. 2, 2016, which claims priority benefit of Japanese Patent Application No. JP 2015-027459 filed in the Japan Patent Office on Feb. 16, 2015. Each of the above-referenced applications is hereby incorporated herein by reference in its entirety.

TECHNICAL FIELD

The present technology relates to a camera module and an electronic apparatus, and more particularly, to a camera module and an electronic apparatus that are capable of lowering the risk of breakage of the camera module, for example.

BACKGROUND ART

Mobile terminals such as smartphones are expected to be thinner and lighter in weight these days. Since the thickness of a smartphone is determined mainly by the height of the camera module that is mounted in the smartphone to capture images (perform imaging), there is a demand for reductions in the heights of such camera modules.

In response to the demand for reductions in the heights of such camera modules, thinner components for camera modules are being developed.

Meanwhile, a mounting method for electrically connecting an imaging element (an image sensor) that captures images to the outside of a camera module may be wire bonding or flip-chip mounting, for example.

By wire bonding, however, a camera module becomes larger in size. Therefore, flip-chip mounting, not wire bonding, is used in the mounting of an imaging element (see Patent Document 1, for example).

Meanwhile, as the components for camera modules have become thinner, the strengths of the components have become lower. Particularly, the proximity components to be brought close to the imaging elements in camera modules have become thinner, and have lower strengths.

Therefore, when a smartphone or the like having a camera module mounted therein falls and is subjected to impact, for example, the proximity components will be deformed and come into contact with the imaging element. In such a case, the risk of cracking (breakage) of the imaging element is higher.

To counter this, a technique has been suggested so that a space between an imaging element and a back-surface-side member provided on an optical back surface on the opposite side of the imaging element from the light receiving surface is filled with a joining material for joining the imaging element to the back-surface-side member (see Patent Document 2, for example).

CITATION LIST

Patent Documents

Patent Document 1: Japanese Patent Application Laid-Open No. 01-87562
Patent Document 2: Japanese Patent Application Laid-Open No. 2006-270939

SUMMARY OF THE INVENTION

Problems to be Solved by the Invention

In a case where the space between an imaging element and a back-surface-side member is filled with a joining material for joining the imaging element to a back-surface-side member, the joining material thermally expands due to heat generated from the imaging element. Then, because of the thermal expansion, a strong force is applied to the bumps that are mechanically weak connection terminals to be used in flip-chip mounting, and therefore, the risk of breakage of the electrical connection of the imaging element might become higher.

The present technology has been made in view of those circumstances, and aims to lower the risk of breakage of a camera module.

Solutions to Problems

A camera module according to the present technology is a camera module that includes: an imaging element that has a light receiving surface to receive light, and is flip-chip mounted on a base; and a joining material that is joined to an optical back surface on the opposite side of the imaging element from the light receiving surface, a space being formed between the joining material and a back-surface-side member provided on the side of the optical back surface. An electronic apparatus according to the present technology is an electronic apparatus that includes such a camera module.

In the present technology, the imaging element has a light receiving surface to receive light, and is flip-chip mounted on a base. A joining material is joined to the optical back surface of the imaging element so that a space is formed between the joining material and a back-surface-side member provided on the side of the optical back surface on the opposite side of the imaging element from the light receiving surface.

It should be noted that the camera module may be an independent device, or may be an internal block in a single device.

Effects of the Invention

According to the present technology, it is possible to lower the risk of breakage of a camera module.

It should be noted that the effects of the present technology are not limited to the effect described herein, and may include any of the effects described in the present disclosure.

MODES FOR CARRYING OUT THE INVENTION

<Example of a Camera Module in which an Imaging Element is Mounted by Wire Bonding>

Figure 1:
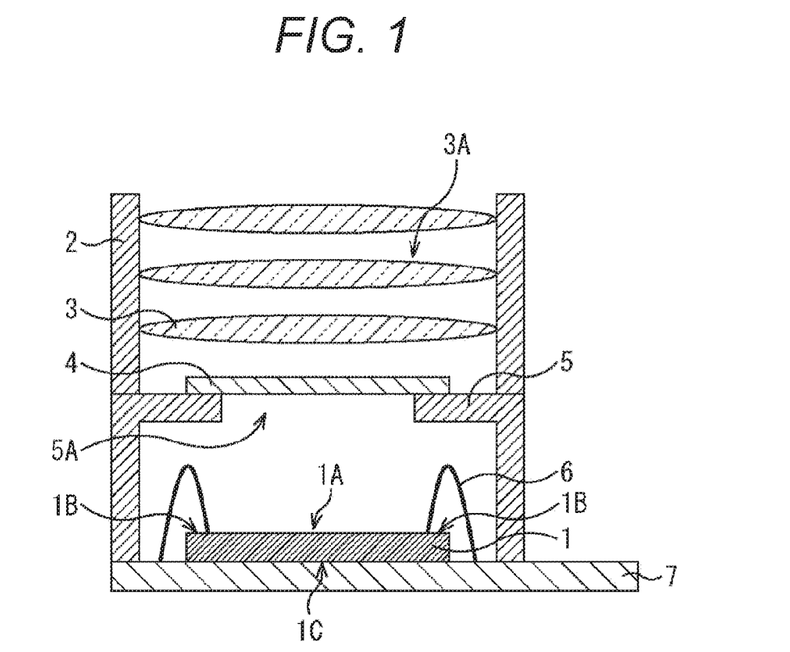
FIG. 1 is a cross-sectional view of an example of a camera module in which an imaging element is mounted by wire bonding.

FIG. 1 is a cross-sectional view of an example of a camera module in which an imaging element is mounted by wire bonding.

Here, in FIG. 1, light enters the camera module from above. Where the surface of the camera module on the light incident side is referred to as the front surface, FIG. 1 shows a cross section of the camera module taken along a plane perpendicular to the front surface as viewed from a side surface in a direction perpendicular to the cross section.

The same applies to the cross-sectional views that will be described later.

In FIG. 1, the camera module includes an imaging element 1, a lens barrel 2, a lens (group) 3, an optical filter (an infrared ray removal filter) 4, a base 5, and a wiring board 7.

The imaging element 1 is in a substantially rectangular shape (a rectangular parallelepiped shape with a small thickness), for example, and has a light receiving surface 1A on one side. The light receiving surface 1A receives light, and an image of the object is to be formed on the light receiving surface 1A. Furthermore, a terminal portion 1B having a terminal for electrically connecting the imaging element 1 to the outside is formed on the outer peripheral portion of the light receiving surface 1A of the imaging element 1.

That is, the light receiving surface 1A is formed on one surface of the imaging element 1 except for its peripheral portion, and the terminal portion 1B is formed at the outer peripheral portion of the light receiving surface 1A (the peripheral portion of the surface on which the light receiving surface 1A of the imaging element 1 is formed).

The imaging element 1 is placed on the wiring board 7, with the light receiving surface 1A facing upward. The terminal portion 1B of the imaging element 1 and the wiring board 7 are connected by bonding wires 6.

The imaging element 1 photoelectrically converts light received by the light receiving surface 1A, and outputs an electric signal to form an image. The electric signal is transmitted to the outside through the terminal portion 1B, the bonding wires 6, and the wiring board 7.

The lens barrel 2 has a cylindrical shape, for example, and the lens 3 is fixed inside the cylindrical portion.

The lens 3 forms a light guiding space for guiding light entering from above to the imaging element 1, and condenses the light on the light receiving surface 1A of the imaging element 1 via the light guiding space, to form an image of the object on the light receiving surface 1A.

The optical filter 4 is secured on an opening 5A (described later) of the base 5 in such a manner as to traverse the light guiding space formed by the lens 3. The optical filter 4 blocks infrared rays that would cause deterioration of an image captured by the imaging element 1.

The base 5 is a rectangular parallelepiped with a small thickness, for example, and the inside thereof is hollow. Further, the opening 5A to serve as an optical surface that is partially open is formed in the upper surface of the rectangular parallelepiped serving as the base 5. Meanwhile, the entire bottom surface on the opposite side from the top surface of the base 5 is open.

The base 5 is placed on the wiring board 7 so that the imaging element 1 on the wiring board 7 is accommodated in the cavity formed inside the base 5. With this arrangement, light coming from above through the opening 5A of the base 5 enters the light receiving surface 1A of the imaging element 1A.

Here, the four side surfaces of the base 5 in the shape of a rectangular parallelepiped can be regarded as wall members that stand perpendicularly to the wiring board 7. In this case, it is safe to say that the periphery of the substantially rectangular imaging element 1 is surrounded by the four wall members that stand perpendicularly to the wiring board 7. It should be noted that the imaging element 1 is accommodated in the base 5 so that the sides of the rectangular region surrounded by the four wall members become parallel to the sides of the substantially rectangular imaging element 1.

Furthermore, the imaging element 1 is placed on the wiring board 7, with the light receiving surface 1A facing upward or toward the opening 5A of the base 5. The wiring board 7 is placed on the side of an optical back surface 1C that is the surface on the opposite side of the imaging element 1 from the light receiving surface 1A.

Therefore, if a member provided on the side of the optical back surface 1C of the imaging element 1 is referred to as a back-surface-side member, the wiring board 7 is a kind of a back-surface-side member.

In the camera module having the above configuration, light from above passes through the lens 3 and the optical filter 4, and is received by the light receiving surface 1A of the imaging element 1. Then, in the imaging element 1, the light received by the light receiving surface 1A is then subjected to photoelectric conversion. Thus, an image is captured. The electric signal of the image obtained through the imaging performed by the imaging element 1 is output to the outside via the terminal portion 1B, the bonding wires 6, and the wiring board 7.

The camera module in which the imaging element 1 is mounted by wire bonding as shown in FIG. 1 is large in size.

<Examples of a Camera Module in which an Imaging Element is Flip-Chip Mounted>

Figure 2:
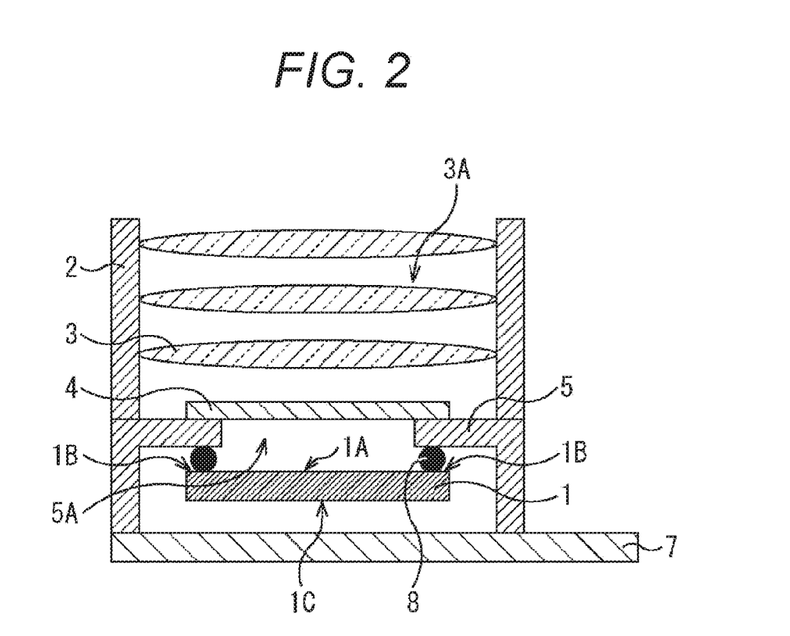
FIG. 2 is a cross-sectional view of a first example of a camera module in which an imaging element is flip-chip mounted.

FIG. 2 is a cross-sectional view of a first example of a camera module in which an imaging element is flip-chip mounted.

It should be noted that, in the drawing, the components equivalent to those in FIG. 1 are denoted by the same reference numerals as those used in FIG. 1, and explanation thereof will not be repeated in the description below.

FIG. 2 differs from FIG. 1 in that the imaging element 1 is flip-chip mounted.

Specifically, bumps (connection terminals) 8 are provided on the terminal portion 1B of the imaging element 1, and the bumps 8 are connected to the outer peripheral portion (surrounding the boundary) of the opening 5A of the base 5. Thus, the imaging element 1A is electrically connected to the base 5 via the terminal portion 1B and the bumps 8.

A predetermined circuit pattern including wires is formed on the base 5 of the flip-chip mounted camera module, and the imaging element 1 electrically connected to the base 5 is further electrically connected to the wiring board 7 serving as a back-surface-side member via the circuit pattern formed on the base 5.

As described above, the imaging element 1 is connected to the wiring board 7 via the base 5. Thus, the electric signal of an image obtained through imaging is transmitted to the outside via the base 5 and the wiring board 7. Further, a power source from the outside is supplied to the imaging element 1 via the wiring board 7 and the base 5.

In the flip-chip mounting, the imaging element 1 is connected to the outer peripheral portion of the opening 5A of the base 5 via the bumps 8, so that a space is formed between the imaging element 1 and the wiring board 7 serving as a back-surface-side member.

By the flip-chip mounting described above, the camera module can be made smaller and thinner.

Meanwhile, as the components such as the wiring board 7 serving as a back-surface-side member become thinner to reduce the height of the camera module, the strengths of the components become lower.

In particular, if the wiring board 7 as a back-surface-side member becomes thinner and its strength becomes lower in the camera module having a space formed between the imaging element 1 and the wiring board 7, the camera module (or the electronic apparatus in which the camera module is mounted) falls, and the wiring board 7 is deformed due to the impact and comes into contact with the imaging element 1. In such a case, there is a high risk that the imaging element 1 cracks (or gets broken).

Figure 3:
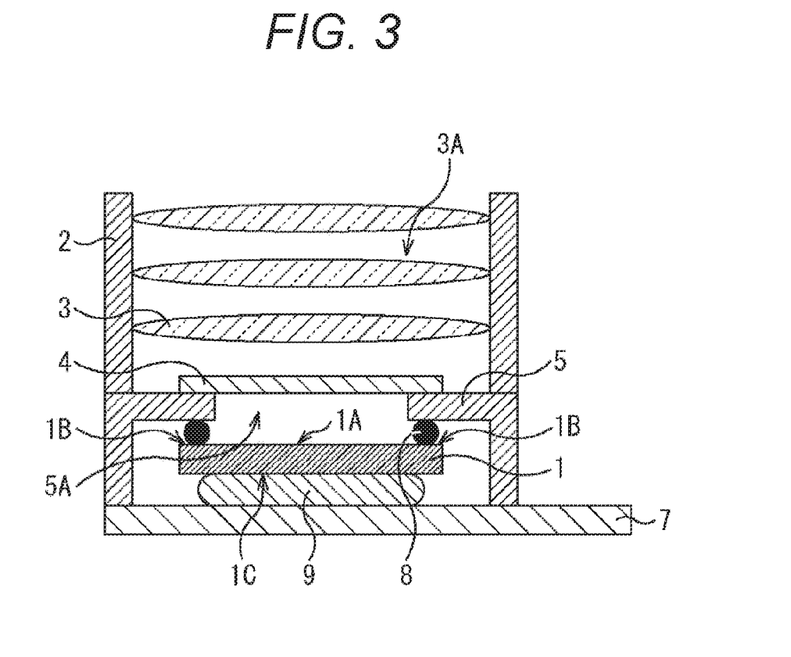
FIG. 3 is a cross-sectional view of a second example of a camera module in which an imaging element is flip-chip mounted.

FIG. 3 is a cross-sectional view of a second example of a camera module in which an imaging element is flip-chip mounted.

It should be noted that, in the drawing, the components equivalent to those in FIG. 2 are denoted by the same reference numerals as those used in FIG. 2, and explanation thereof will not be repeated in the description below.

The example shown in FIG. 3 differs from the case shown in FIG. 2 in that the space between the imaging element 1 and the wiring board 7 as a back-surface-side member is filled with a joining material 9 for joining the imaging element 1 to the wiring board 7, and thus, there is no space between the imaging element 1 and the wiring board 7.

As the space between the imaging element 1 and the wiring board 7 is filled with the joining material 9 in FIG. 3, the strength of the wiring board 7 is maintained so that the wiring board 7 is not easily deformed.

That is, in FIG. 3, as the imaging element 1 and the wiring board 7 are integrated via the joining material 9, the equivalent strength is increased.

Thus, in the camera module shown in FIG. 3, it is possible to lower the risk of cracking of the imaging element 1 due to the impact of falling.

In the camera module shown in FIG. 3, however, the imaging element 1 and the wiring board 7 are integrated with the joining material 9, and therefore, thermal expansion of the joining material 9 due to heat generated from the imaging element 1 applies a strong force to the bumps 8 that are disposed between the imaging element 1 and the base 5 and has a low mechanical strength. As a result, the risk of breakage of the bumps 8 or cutoff of the electrical connection between the imaging element 1 and the base 5 might become higher.

The imaging element 1 has become more sophisticated recently, and the circuit size has become larger with the increased sophistication. Therefore, the amount of heat generated from the imaging element 1 tends to increase, and the risk of breakage of the bumps 8 due to thermal expansion might become higher.

<Embodiment of a Camera Module to which Present Technology is Applied>

Figure 4:
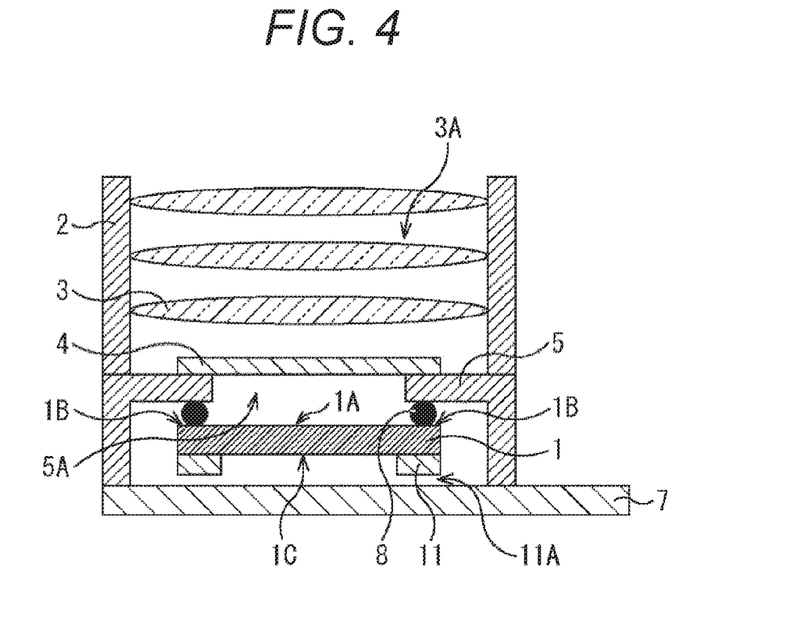
FIG. 4 is a cross-sectional view of an example configuration of an embodiment of a camera module to which the present technology is applied.

FIG. 4 is a cross-sectional view of an example configuration of an embodiment of a camera module to which the present technology is applied.

It should be noted that, in the drawing, the components equivalent to those in FIG. 3 are denoted by the same reference numerals as those used in FIG. 3, and explanation thereof will not be repeated in the description below.

The camera module shown in FIG. 4 is similar to that shown in FIG. 3 in including an imaging element 1 and bumps 8. However, the camera module shown in FIG. 4 differs from that shown in FIG. 3 in that a joining material 11 is provided in place of the joining material 9.

In FIG. 4, resin, for example, is joined as the joining material 11 to the optical back surface 1C of the imaging element 1 so that a space 114 is formed between the wiring board 7 as a back-surface-side member and the joining material 11.

As described above, the joining material 11 joined to the optical back surface 1C of the imaging element 1 so that the space 114 is formed between the wiring board 7 and the joining material 11 functions as a stopper (a safety device) for preventing the wiring board 7 from coming into contact with the imaging element 1 in a case where the wiring board 7 is deformed.

That is, when the camera module falls and is subjected to impact, the joining material 11 reduces deformation of the wiring board 7, and lowers the risk of the wiring board 7 coming into contact with the imaging element 1.

Figure 5:
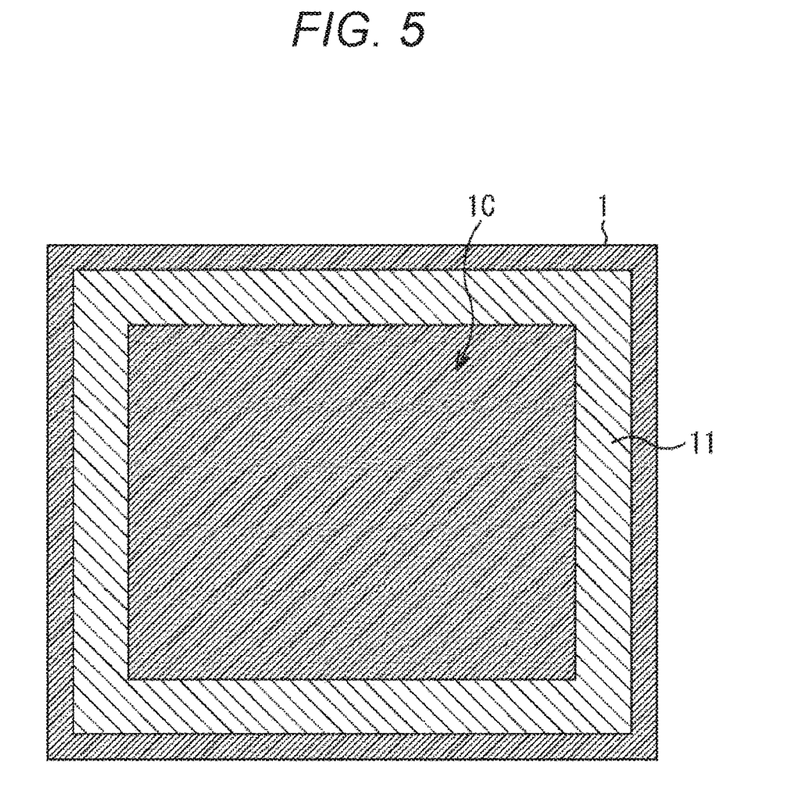
FIG. 5 is a plan view of an example configuration on the side of the optical back surface 1C of the imaging element 1 of the camera module.

FIG. 5 is a plan view of an example configuration on the side of the optical back surface 1C of the imaging element 1 of the camera module shown in FIG. 4.

In FIG. 5, the joining material 11 is seamlessly joined to the entire peripheral portion of the optical back surface 1C of the imaging element 1, and is in the form of a frame.

Here, the joining material 11 can be joined not to the entire peripheral portion but only to part of the peripheral portion of the optical back surface 1C of the imaging element 1. A case where the joining material 11 is joined only to part of the peripheral portion of the optical back surface 1C of the imaging element 1 will be described later.

Also, the joining material 11 may be joined not only to the peripheral portion of the optical back surface 1C of the imaging element 1 but also to the central portion, and the joining material 11 may be formed in a rectangular shape, for example.

However, in a case where the camera module falls and is subjected to impact, the central portion (the portion corresponding to the central portion of the imaging element 1) of the wiring board 7 is greatly deformed. That is, the central portion of the wiring board 7 is greatly distorted in the vertical direction in the cross-sectional view in FIG. 4.

Therefore, in a case where the joining material 11 is joined to the entire peripheral portion and the entire central portion, there is a possibility that a strong force as a point load is momentarily applied to the central portion of the wiring board 7 via the joining material 11.

In a case where the joining material 11 is joined only to the peripheral portion, on the other hand, a strong force is not applied to the central portion of the wiring board 7 via the joining material 11 as in a case where the joining material 11 is joined to the peripheral portion and the central portion.

Therefore, in a case where the joining material 11 is joined only to the peripheral portion, the risk of cracking of the imaging element 1 due to a stronger force applied to the central portion of the wiring board 7 via the joining material 11 can be made lower than that in a case where the joining material 11 is joined to the peripheral portion and the central portion.

It should be noted that the joining material 11 may not be joined to the optical back surface 1C of the imaging element 1, but may be joined to the wiring board 7 facing the optical back surface 1C so that a space is formed between the imaging element 1 and the joining material 11.

However, to maintain electrical connection and reduce the height, a thermocompression bonding process involving anisotropic conductive film (ACF) is often used for connecting the base 5 and the wiring board 7. Therefore, if the joining material 11 is placed on the side of the wiring board 7, there is a possibility that the joining material 11 melts due to momentary high temperature when thermocompression bonding is performed to join the base 5 to the wiring board 7. Then, in a case where the joining material 11 melts, it becomes difficult to control the height of the joining material 11 serving as a stopper.

In view of this, it is easier to manufacture the camera module by joining the joining material 11 as a stopper to the optical back surface 1C of the imaging element 1.

Figure 6A:
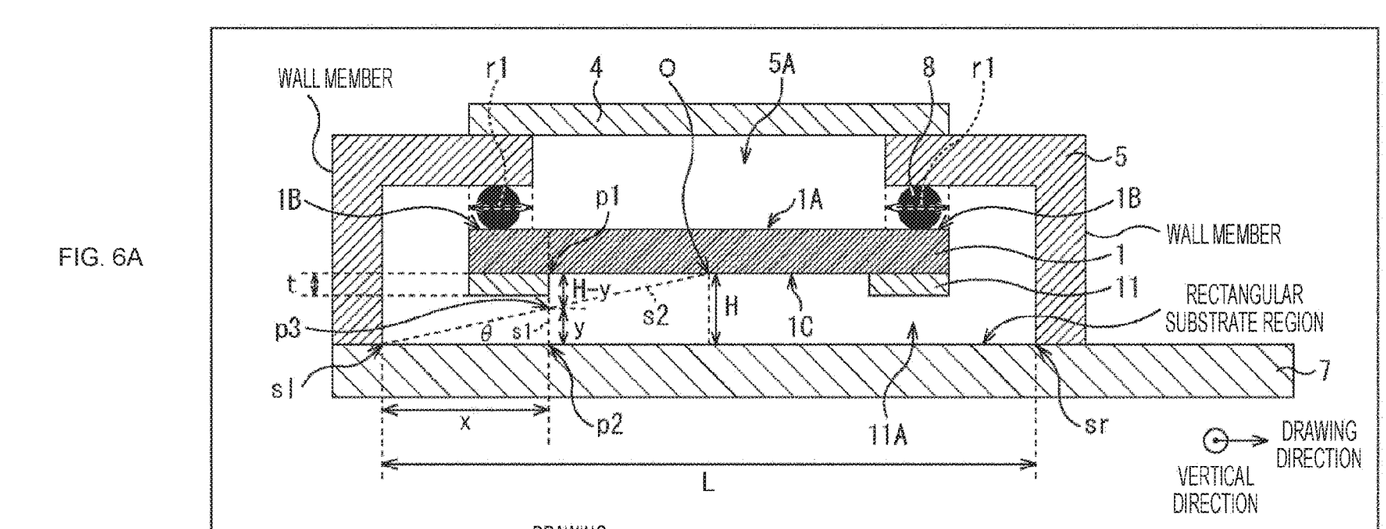
FIGS. 6A and 6B are diagrams for explaining a joining material 11 in detail.
Figure 6B:
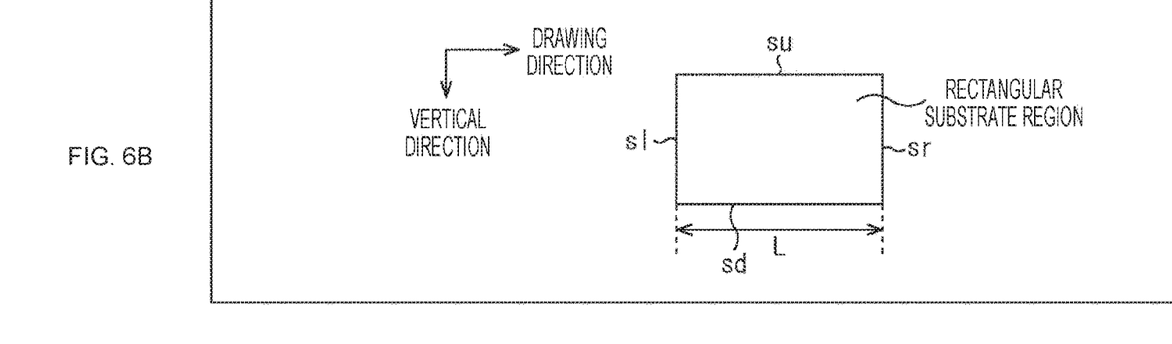

FIGS. 6A and 6B are diagrams for explaining the joining material 11 in detail.

Specifically, FIG. 6A is a cross-sectional view of part of the camera module, and FIG. 6B is a plan view of a rectangular substrate region that will be described later.

The joining material 11 is joined so that at least part of the projection region r1 formed through projection of the base 5 onto the light receiving surface 1A of the imaging element 1 is covered in cross-section.

As the bumps 8 are connected to the outer peripheral portion of the opening 5A formed in the upper surface of the base 5 so that the imaging element 1 is flip-chip mounted, the opening 5A is in the shape of a rectangle that is smaller in size than the imaging element 1.

In a case where the imaging element 1 is flip-chip mounted by connecting the bumps 8 to the outer peripheral portion of the opening 5A, a shadow of the outer peripheral portion of the opening 5A is formed at the peripheral portion of the imaging element 1 (an inner portion along the boundary of the imaging element 1) when the camera module is viewed from above (from the side of the opening 5A).

The region of the shadow formed at the peripheral portion of the imaging element 1 is the projection region r1.

As the joining material 11 is positioned so as to cover at least part of the projection region r1 formed through projection of the base 5 onto the light receiving surface 1A of the imaging element 1 in cross-section, it is possible to lower the risk of cracking of the imaging element 1 when the wiring board 7 as a back-surface-side member is distorted and comes into contact with the joining material 11.

In a case where the joining material 11 is positioned so as not to cover the projection region r1, or where the joining material 11 is positioned closer to the central portion of the imaging element 1 than the projection region r1 of the imaging element 1, the joining material 11 is not supported by the base 5 to resist pressure applied from below.

In this case, the joining material 11 plays a role of a weight on the imaging element 1. Therefore, when the camera module falls and is subjected to impact, strong pressure is applied to the portion of the imaging element 1 to which the joining material 11 is joined. Furthermore, there is no support from the base 5, and the risk of cracking of the imaging element 1 becomes higher accordingly.

On the other hand, in a case where the joining material 11 is positioned so as to cover (at least part of) the projection region r1, on the other hand, the joining material 11 is supported by the base 5 via the imaging element 1 and the bumps 8, to resist the pressure applied to the joining material 11 from below. Thus, the joining material 11 can buffer the pressure to be applied to the imaging element 1.

Meanwhile, the thickness (height) t of the joining material 11 is designed as described below.

Specifically, as described above with reference to FIG. 1, the four side surfaces of the base 5 in the shape of a rectangular parallelepiped can be regarded as wall members that stand perpendicularly to the wiring board 7. In this case, it is safe to say that the periphery of the substantially rectangular imaging element 1 is surrounded by the four wall members that stand perpendicularly to the wiring board 7 serving as a back-surface-side member.

Of the four sides su, sl, sd, and sr, which constitute the rectangular region (hereinafter also referred to as the rectangular substrate region) surrounded by the four wall members on the wiring board 7 serving as a back-surface-side member, the length of two facing sides is represented by L.

In FIGS. 6A and 6B, of the four sides su, sl, sd, and sr, which constitute the rectangular substrate region, the length of two facing sides su and sd is L.

Where the direction parallel to the two facing sides su and sd of the length L is the drawing direction in the rectangular substrate region, the two facing sides su and sd of the rectangular substrate region are the sides extending in the drawing direction, and the two facing sides sl and sr other than the two facing sides su and sd are vertical sides perpendicular to the drawing direction on the wiring board 7.

Meanwhile, H represents the distance between (the optical back surface 1C of) the imaging element 1 and the wiring board 7 serving as a back-surface-side member.

Further, x represents the shorter one of the distances between the point p2 at which a perpendicular s1 extending from the structural edge p1 of the joining material 11 on the central side of the imaging element 1 toward the wiring board 7 as a back-surface-side member intersects with the wiring board 7, and the two facing sides sl and sr other than the two facing sides su and sd of the length L in the rectangular substrate region.

As for the distances between the point p2 and the two facing sides sl and sr, the distance between the point p2 and the side sl is shorter than the distance between the point p2 and the side sr in FIGS. 6A and 6B.

Also, in FIGS. 6A and 6B, in the two-dimensional plane defined by the drawing direction and the vertical direction, the coordinates of the center (gravity center) of the rectangular substrate region coincide with the coordinates of the center of the substantially rectangular imaging element 1.

Further, in FIGS. 6A and 6B THETA(θ) represents the angle between the wiring board 7 as a back-surface-side member and the line segment s2 connecting the side sl located at the distance x from the point p2 and the center O on the optical back surface 1C of the imaging element 1, the side sl being of the four sides su, sl, sd, and sr, which constitute the rectangular substrate region.

Furthermore, y represents the distance between the point p2 and the intersection point p3 between the line segments s1 and s2.

In order for the joining material 11 to function as a stopper, the wiring board 7 must come into contact with the joining material 11 before coming into contact with the imaging element 1 when the wiring board 7 is distorted.

In FIGS. 6A and 6B when the wiring board 7 is distorted so that the center of the rectangular substrate region on the wiring board 7 moves upward by H, the wiring board 7 comes into contact with the imaging element 1.

In a case where the wiring board 7 is distorted so that the center of the rectangular substrate region on the wiring board 7 moves upward by H, the point p2 on the wiring board 7 moves upward by the distance y. Then, when the wiring board 7 does not come into contact with the joining material 11 while the point p2 on the wiring board 7 moves by the distance y, the center of the rectangular substrate region on the wiring board 7 comes into contact with the imaging element 1.

Therefore, the thickness t of the joining material 11 needs to be such that the wiring board 7 comes into contact with the joining material 11 while the point p2 on the wiring board 7 moves upward by the distance y.

In a case where the point p2 on the wiring board 7 moves upward by the distance y, or where the point p2 moves to the point p3, the thickness t of the joining material 11 needs to be equal to or greater than a distance (H−y) or satisfy Expression (1), since the distance between the point p3 and the imaging element 1 is (H−y).

$$t \geq H-y \quad (1)$$

Here, in FIGS. 6A and 6B, tan (THETA) is expressed by Expression (2), and y is expressed by Expression (3).

$$\tan(\text{THETA}) = H/(L/2) \quad (2)$$

$$Y = x \cdot \tan(\text{THETA}) \quad (3)$$

With the use of Expressions (2) and (3), y is subtracted from Expression (1), and Expression (4) is obtained.

$$t \geq H(1-2x/L) \quad (4)$$

According to Expression (4), the thickness t of the joining material 11 needs to be equal to or greater than H(1−2x/L).

Since a space 11A needs to be formed between the joining material 11 and the wiring board 7, the thickness t of the joining material 11 can be determined within the range of H(1−2x/L) to H.

It should be noted that, as the joining material 11, a harder material than the wiring board 7 may be used, or a softer material may be used. That is, as the joining material 11, a material with a higher Young's modulus than the Young's modulus of the wiring board 7 may be used, or a material with a lower Young's modulus may be used. However, in a case where a harder material than the wiring board 7 is used as the joining material 11, when the wiring board 7 is distorted and comes into contact with the joining material 11, the pressure from the wiring board 7 can be more effectively buffered at the joining material 11. Therefore, a harder material than the wiring board 7 is preferably used as the joining material 11 if possible.

<Method of Manufacturing a Camera Module>

Figure 7:
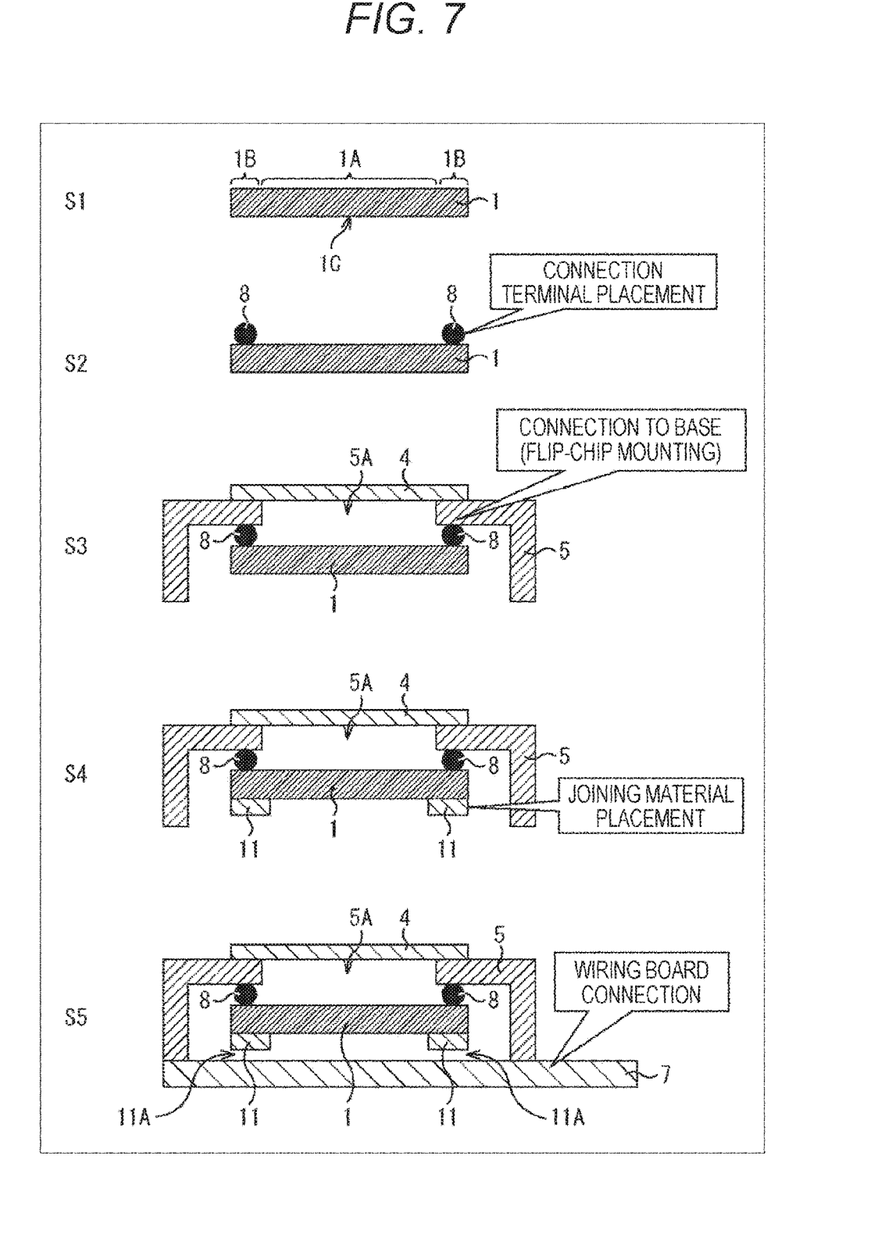
FIG. 7 is a diagram for explaining an example method of manufacturing the camera module.

FIG. 7 is a diagram for explaining an example method of manufacturing the camera module shown in FIG. 4.

The apparatus (not shown) for manufacturing the camera module manufactures the imaging element 1 in step S1, and places the bumps 8 as the connection terminals on the terminal portion 1B of the imaging element 1 in step S2.

In step S3, the manufacturing apparatus mounts the imaging element 1 in a flip-chip fashion onto the base 5 having the optical filter 4 placed on the opening 5A, with the light receiving surface 1A facing the opening 5A.

Further, in step S4, the manufacturing apparatus joins (positions) the joining material 11 to the optical back surface 1C of the imaging element 1.

Then, in step S5, the manufacturing apparatus connects the wiring board 7 as a back-surface-side member to the base 5, and thus completes the camera module having the space 11A formed between the joining material 11 and the wiring board 7.

<Variations of the Layout of the Joining Material 11>

Figure 8A:
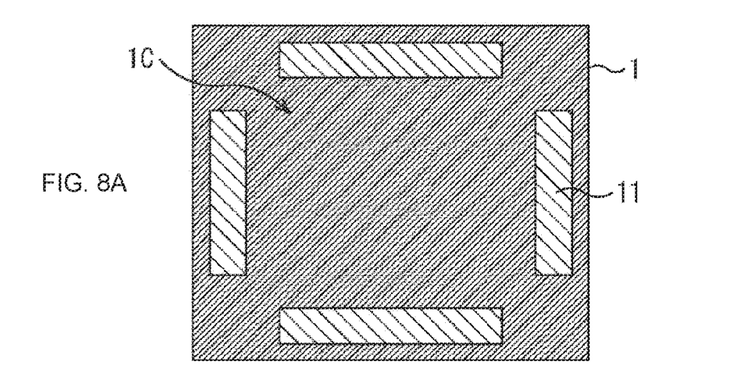
FIGS. 8A, 8B and 8C are plan views showing other example layouts of the joining material 11.
Figure 8B:
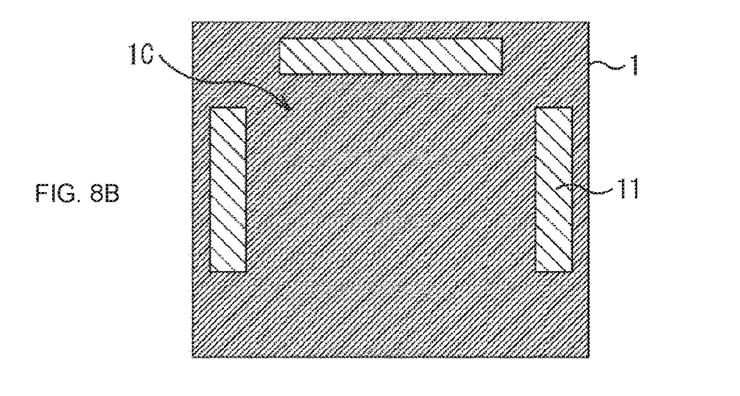
Figure 8C:
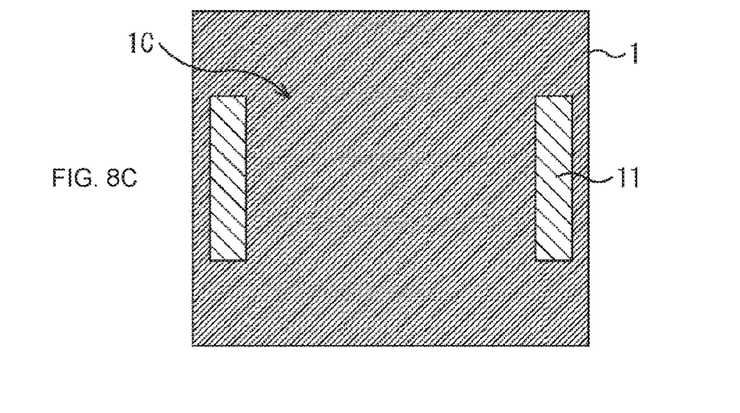

FIGS. 8A, 8B and 8C are plan views showing other example layouts of the joining material 11.

In the above case, as described with reference to FIG. 5, the joining material 11 is joined to the entire peripheral portion of the optical back surface 1C of the imaging element 1, and the joining material 11 is formed in the shape of a frame. However, the joining material 11 may not be joined to the entire peripheral portion of the optical back surface 1C of the imaging element 1, but may be joined only to part of the peripheral portion of the optical back surface 1C.

That is, the joining material 11 can be provided along four sides, three sides, or two facing sides of the peripheral portion of the optical back surface 1C of the imaging element 1.

FIG. 8A shows an imaging element 1 in which a joining material 11 in the form of bars is provided along the four sides of the peripheral portion of the optical back surface 1C of the imaging element 1.

FIG. 8B shows an imaging element 1 in which a joining material 11 in the form of bars is provided along three sides of the peripheral portion of the optical back surface 1C of the imaging element 1.

FIG. 8C shows an imaging element 1 in which a joining material 11 in the form of bars is provided along two facing sides of the peripheral portion of the optical back surface 1C of the imaging element 1.

As described above, the joining material 11 can be provided along at least two facing sides of the peripheral portion of the optical back surface 1C of the imaging element 1.

It should be noted that, when the camera module falls and is subjected to impact, the portions that will be greatly deformed in the wiring board 7 are the central portions of the respective sides su, sl, sd, and sr of the rectangular substrate region. Therefore, in FIGS. 8A, 8B and 8C at the peripheral portion of the optical back surface 1C of each imaging element 1, the joining material 11 is located to cover positions with which the side su, sl, sd, or sr of the rectangular substrate region will come into contact when the wiring board 7 is distorted.

In this case, it is possible to effectively lower the risk of cracking of each imaging element 1 due to large pressure applied to the imaging element 1 when the wiring board 7 is distorted.

Figure 9A:
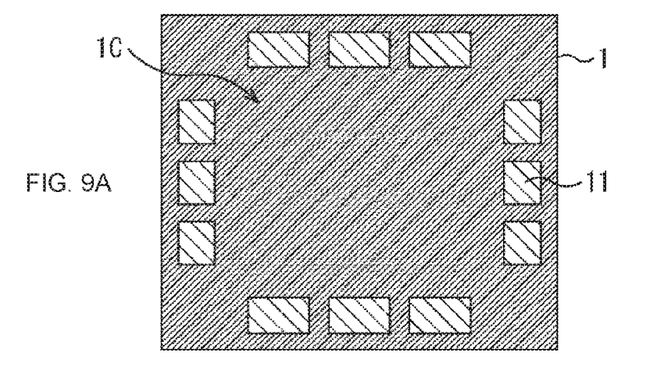
FIGS. 9A, 9B and 9C are plan views showing further example layouts of the joining material 11.
Figure 9B:
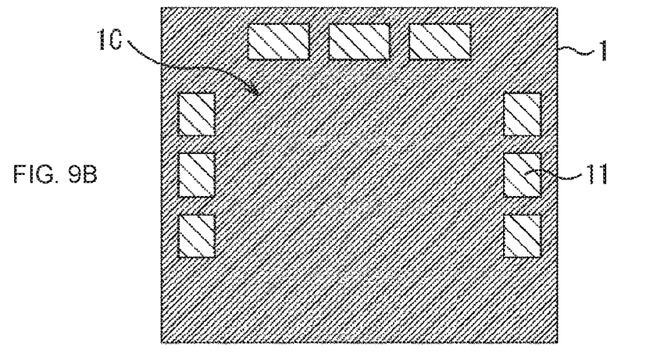
Figure 9C:
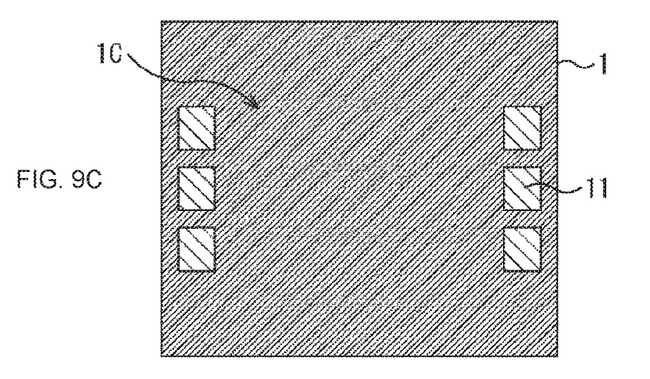

FIGS. 9A, 9B and 9C are plan views showing further example layouts of the joining material 11.

In FIGS. 9A, 9B and 9C each joining material 11 is provided in a fragmentary fashion along four sides, three sides, or two facing sides of the peripheral portion of the optical back surface 1C of the imaging element 1.

FIG. 9A shows an imaging element 1 in which a joining material 11 in the form of bars is provided in a fragmentary fashion along the four sides of the peripheral portion of the optical back surface 1C of the imaging element 1.

FIG. 9B shows an imaging element 1 in which a joining material 11 in the form of bars is provided in a fragmentary fashion along three sides of the peripheral portion of the optical back surface 1C of the imaging element 1.

FIG. 9C shows an imaging element 1 in which a joining material 11 in the form of bars is provided in a fragmentary fashion along two facing sides of the peripheral portion of the optical back surface 1C of the imaging element 1.

In FIGS. 9A, 9B and 9C at the peripheral portion of the optical back surface 1C of each imaging element 1, the joining material 11 is located to cover positions with which the side su, sl, sd, or sr of the rectangular substrate region will come into contact when the wiring board 7 is distorted, as in FIGS. 8A, 8B and 8C.

Thus, in FIGS. 9A, 9B and 9C it is also possible to lower the risk of cracking of each imaging element 1 as in FIGS. 8A, 8B and 8C.

However, in FIGS. 9A, 9B and 9C the joining material 11 in the form of bars is provided in a fragmentary fashion, and therefore, the effect to lower the risk of cracking of each imaging element 1 is slightly smaller than that in each case shown in FIGS. 8A, 8B and 8C. Despite that, it is possible to reduce the amount of material used as the joining material 11, and thus, cut costs.

It should be noted that, in FIGS. 8A, 8B, 8C and Figs. 9A, 9B, 9C the joining material 11 in the form of bars is employed, but the form of the joining material 11 is not limited to bars. For example, the joining material 11 may have a circular (spherical) shape, or a polygonal shape such as a triangular shape or pentagonal shape.

As described above, in the camera module shown in FIG. 4, the joining material 11 as a stopper is separated from the wiring board 7 so as not to come into contact with the wiring board 7, and is joined to the optical back surface 1C of the imaging element 1. As a result, even if the joining material 11 thermally expands due to heat generated from the imaging element 1, no strong force will be applied to the bumps 8, as described above with reference to FIG. 3. Thus, the risk of breakage of the bumps 8 due to thermal expansion of the joining material 11 can be lowered.

Furthermore, it is possible to reduce the pressure to be applied from the wiring board 7 to the imaging element 1 when the camera module falls and is subjected to impact, and the wiring board 7 is deformed. Thus, the risk of cracking of the imaging element 1 can be lowered.

It should be noted that the simulations conducted by the present inventor confirmed that, in a case where the joining material 11 was provided, the imaging element 1 and the wiring board 7 did not come into contact with each other before subjected to impact of a value approximately twice higher than that in a case where the joining material 11 was not provided.

<Examples of Use of a Camera Module>

Figure 10:
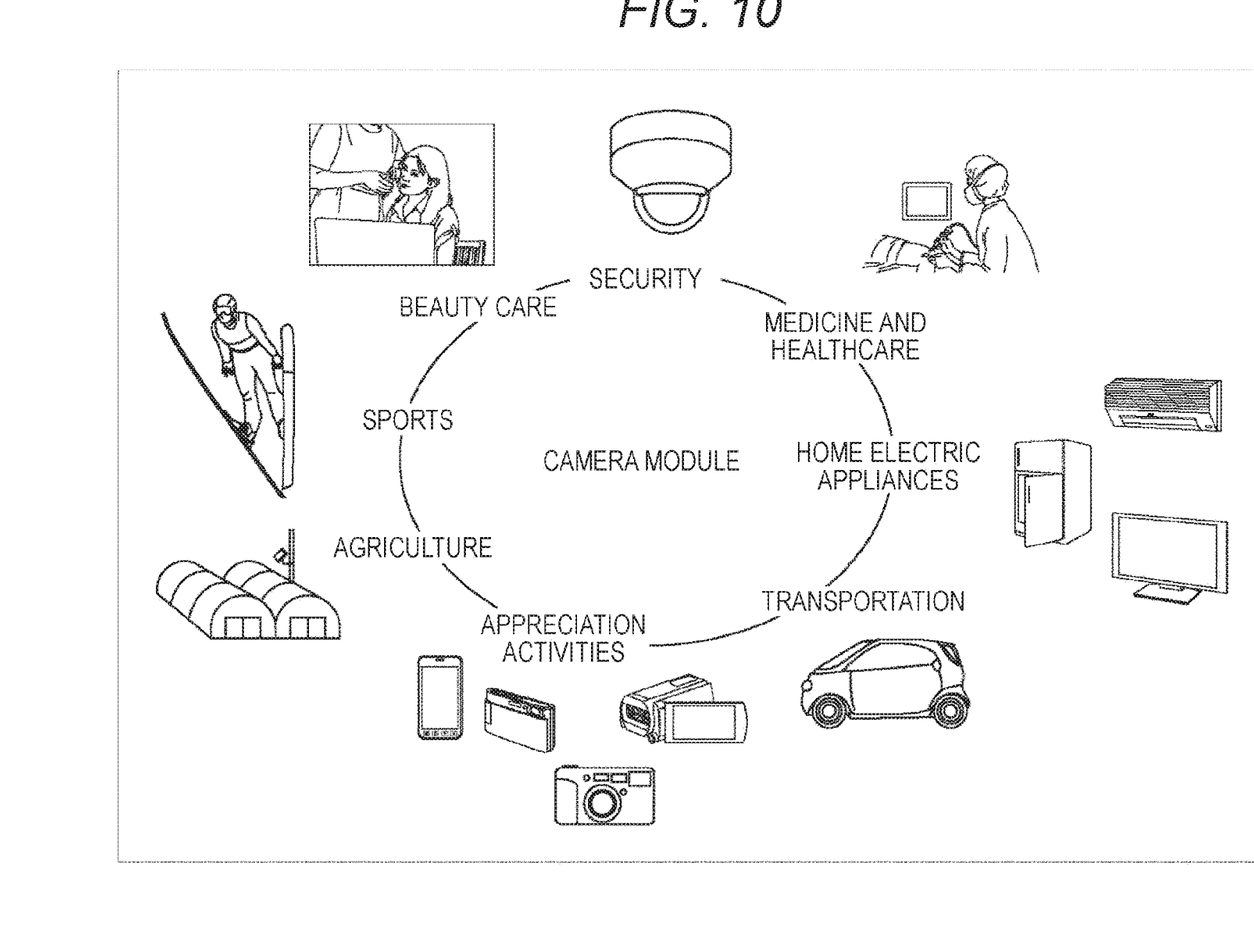
FIG. 10 is a diagram showing examples of use of the camera module.

FIG. 10 is a diagram showing examples of use of the camera module described above.

The above described camera module can be used in various electronic apparatuses that sense light such as visible light, infrared light, ultraviolet light, or an X-ray, as described below.

Electronic apparatuses that take images for appreciation activities, such as digital cameras and portable devices with camera functions.

Electronic apparatuses for transportation use, such as vehicle-mounted sensors that take images of the front, the back, the surroundings, and the inside of an automobile to perform safe driving like an automatic stop and recognize a driver's condition, surveillance cameras for monitoring running vehicles and roads, and ranging sensors for measuring distances between vehicles.

Electronic apparatuses to be used in conjunction with home electric appliances, such as television sets, refrigerators, and air conditioners, to take images of gestures of users and operate the appliances in accordance with the gestures.

Electronic apparatuses for medical care use and health care use, such as endoscopes and devices for receiving infrared light for angiography.

Electronic apparatuses for security use, such as surveillance cameras for crime prevention and cameras for personal authentication.

Electronic apparatuses for beauty care use, such as skin measurement devices configured to image a skin and microscopes for imaging a scalp.

Electronic apparatuses for sporting use, such as action cameras and wearable cameras for sports.

Electronic apparatuses for agricultural use such as cameras for monitoring conditions of fields and crops.

<Digital Camera Using a Camera Module>

Figure 11:
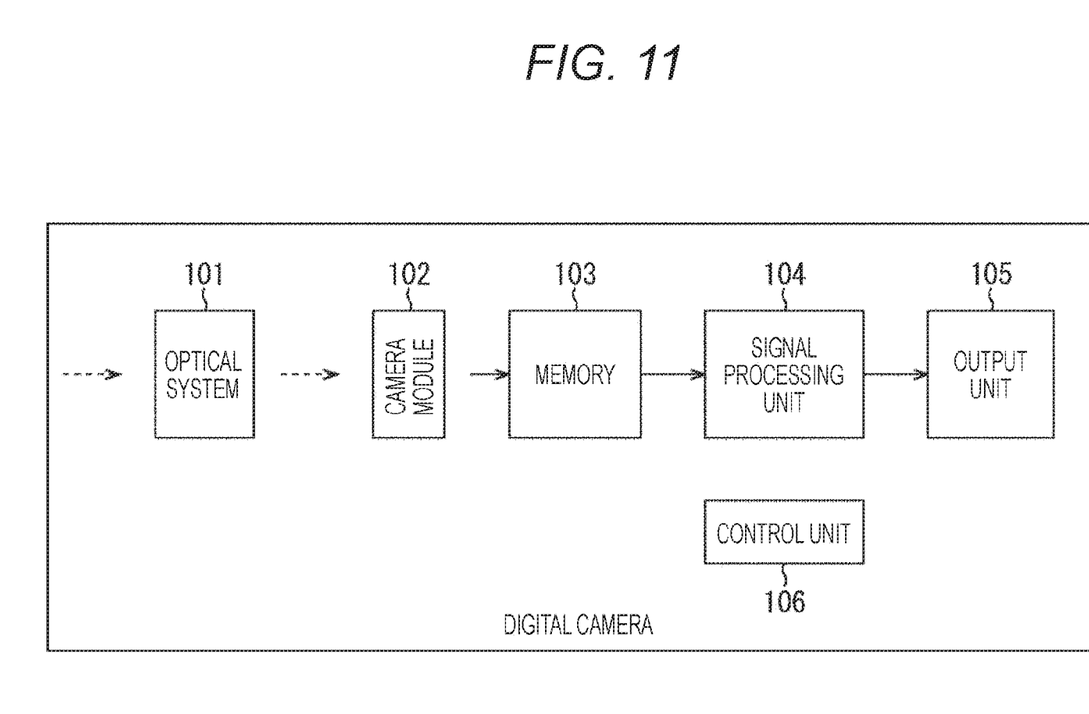
FIG. 11 is a block diagram showing an example configuration of an embodiment of a digital camera as an electronic apparatus that uses the camera module.

FIG. 11 is a block diagram showing an example configuration of an embodiment of a digital camera as an electronic apparatus that uses the above described camera module.

With the digital camera, it is possible to capture both still images and moving images.

In FIG. 11, the digital camera includes an optical system 101, a camera module 102, a memory 103, a signal processing unit 104, an output unit 105, and a control unit 106.

The optical system 101 includes a zoom lens, a focus lens, a diaphragm, and the like (not shown), and causes external light to enter the camera module 102.

The camera module 102 has a configuration similar to the camera module in FIG. 4, for example. The camera module 102 receives the incident light from the optical system 101, performs photoelectric conversion, and outputs the image data corresponding to the incident light from the optical system 101.

The memory 103 temporarily stores the image data output from the camera module 102.

The signal processing unit 104 performs processing as signal processing using the image data stored in the memory 103, such as denoising and white balance adjustment, and supplies the resultant image data to the output unit 105.

The output unit 105 outputs the image data supplied from the signal processing unit 104.

Specifically, the output unit 105 has a display (not shown) formed with liquid crystal or the like, and displays the image corresponding to the image data supplied from the signal processing unit 104 as a so-called through-lens image.

The output unit 105 also includes a driver (not shown) for driving a recording medium such as a semiconductor memory, a magnetic disk, or an optical disk, and records the image data supplied from the signal processing unit 104 on the recording medium.

The control unit 106 controls each of the blocks constituting the digital camera, in accordance with a user operation or the like.

In the digital camera having the above configuration, the camera module 102 receives incident light from the optical system 101, and outputs image data in accordance with the incident light.

The image data output from the camera module 102 is supplied to the memory 103, and is stored therein. The image data stored in the memory 103 is subjected to signal processing by the signal processing unit 104, and the resultant image data is supplied to the output unit 105, which in turn outputs the image data.

It should be noted that embodiments of the present technology are not limited to the above described embodiments, and various modifications may be made to them without departing from the scope of the present technology.

Furthermore, the advantageous effects described in the present specification are merely examples, and the advantageous effects of the present technology are not limited to them and may include other effects.

It should be noted that the present technology may also be embodied in the configurations described below.

<1>

A camera module including:

an imaging element that has a light receiving surface to receive light, and is flip-chip mounted on a base; and a joining material that is joined to an optical back surface on the opposite side of the imaging element from the light receiving surface, a space being formed between the joining material and a back-surface-side member provided on the side of the optical back surface.

<2>

The camera module of <1>, in which the joining material is joined to part of a peripheral portion of the optical back surface of the imaging element, or to the entire peripheral portion of the optical back surface of the imaging element.

<3>

The camera module of <2>, in which the base has an opening, and the imaging element is flip-chip mounted on the base, with the light receiving surface facing the opening of the base.

<4>

The camera module of <3>, in which the joining material is joined so as to cover at least part of a projection region in cross-section, the projection region being formed through projection of the base onto the light receiving surface of the imaging element.

<5>

The camera module of any of <2> to <4>, in which the periphery of the imaging element having a substantially rectangular shape is surrounded by four wall members standing perpendicularly to the back-surface-side member, and the thickness t of the joining material is not smaller than $H(1-2x/L)$, where L represents the length of two facing sides of the four sides forming the rectangular region surrounded by the four wall members on the back-surface-side member, H represents the distance between the imaging element and the back-surface-side member, and x represents the shorter one of the distances between the point at which the back-surface-side member intersects with a perpendicular extending from the structural edge of the joining material on the side of the center of the imaging element toward the back-surface-side member, and the other two facing sides than the two facing sides of the rectangular region.

<6>

The camera module of any of <2> to <5>, in which the joining material is provided along the four sides, three sides, or two facing sides of the peripheral portion of the imaging element having a substantially rectangular shape.

<7>

The camera module of <6>, in which the joining material is provided in a fragmentary fashion along the four sides, three sides, or two facing sides of the peripheral portion of the imaging element having the substantially rectangular shape.

<8>

An electronic apparatus including:

an optical system that condenses light; and a camera module that receives light and captures an image, in which the camera module includes:

an imaging element that has a light receiving surface to receive light, and is flip-chip mounted on a base; and a joining material that is joined to an optical back surface on the opposite side of the imaging element from the light receiving surface, a space being formed between the joining material and a back-surface-side member provided on the side of the optical back surface.

REFERENCE SIGNS LIST

1 Imaging element
1A Light receiving surface
1B Terminal portion
1C Optical back surface
2 Lens barrel
3 Lens
3A Light guiding space
4 Optical filter
5 Substrate
5A Opening
6 Bonding wire
7 Wiring board
8 Bump
9, 11 Joining material
101 Optical system
102 Camera module
103 Memory
104 Signal processing unit
105 Output unit
106 Control unit

The invention claimed is:

1. A camera module, comprising:

a base;

a back-surface-side member;

an imaging element that is flip-chip connected to the base, wherein the imaging element comprises a light receiving surface to receive light; and a joining material that is directly connected to one of a part of a peripheral portion of an optical back surface of the imaging element, or to an entire part of the peripheral portion of the optical back surface of the imaging element, wherein the joining material is arranged in a fragmented pattern along, one of four sides, three sides, or two facing sides of the peripheral portion of the imaging element, wherein the imaging element has a substantially rectangular shape, wherein the optical back surface is opposite to the light receiving surface, wherein a space is between the joining material and the back-surface-side member, and wherein the back-surface-side member is below the optical back surface.

2. The camera module according to claim 1, wherein the base comprises an opening portion, the imaging element is flip-chip connected to the base, and the light receiving surface faces the opening portion of the base.

3. The camera module according to claim 2, wherein the joining material is connected to the imaging element so as to cover at least a part of a projection region in a cross-section view, and wherein the projection region is a projection of the base onto the light receiving surface.

4. The camera module according to claim 1, wherein the peripheral portion of the imaging element has a substantially rectangular shape, wherein the peripheral portion of the imaging element is surrounded by four walls of the base, wherein the four walls stand perpendicular to the back-surface-side member, wherein a thickness t of the joining material is not smaller than $H(1-2x/L)$, wherein L represents a length of a first pair of opposing sides of a rectangular region that is surrounded by the four walls, wherein H represents a first distance between the imaging element and the back-surface-side member, wherein x represents a second distance that is between a point at which the back-surface-side member intersects with a perpendicular that extends from a structural edge of the joining material, and a second pair of opposing sides of the rectangular region, and wherein the structural edge faces a center of the imaging element.

5. An electronic apparatus, comprising:

an optical system configured to condense light; and a camera module configured to receive light and capture an image, wherein the camera module includes:

a base;

a back-surface-side member;

an imaging element that is flip-chip connected to the base, wherein the imaging element comprises a light receiving surface to receive light; and a joining material that is connected to at least a part of a peripheral portion of an optical back surface of the imaging element or an entire part of the peripheral portion of the optical back surface, wherein the joining material is arranged in a fragmented pattern along, one of four sides, three sides, or two facing sides of the peripheral portion of the imaging element, wherein the imaging element has a substantially rectangular shape, wherein the optical back surface is opposite to the light receiving surface, wherein a space is between the joining material and the back-surface-side member, and wherein the back-surface-side member is below the optical back surface.

\* \* \* \* \*